United States Patent [19]

Yokota et al.

[11] Patent Number: 4,966,520
[45] Date of Patent: Oct. 30, 1990

[54] METHOD OF POSITIONING OBJECTS TO BE MEASURED

[75] Inventors: Keiichi Yokota, Nirasaki; Ryuichi Takebuchi, Yamanashi, both of Japan

[73] Assignee: Tokyo Electron Limited, Tokyo, Japan

[21] Appl. No.: 430,589

[22] Filed: Nov. 1, 1989

[30] Foreign Application Priority Data

Nov. 2, 1988 [JP] Japan .................................. 63-278389

[51] Int. Cl.$^5$ ............................................. H01L 21/66
[52] U.S. Cl. ......................................... 414/786; 437/8; 437/924; 414/754
[58] Field of Search ............... 414/786, 754, 222, 223, 414/416; 437/8, 924

[56] References Cited

U.S. PATENT DOCUMENTS

| | | | |
|---|---|---|---|
| 4,759,681 | 7/1988 | Nogami | 414/416 X |
| 4,818,169 | 4/1989 | Schram et al. | 414/416 X |

FOREIGN PATENT DOCUMENTS

| | | | |
|---|---|---|---|
| 59-214234 | 12/1984 | Japan | 437/8 |
| 60-59746 | 4/1985 | Japan | 437/8 |
| 60-144947 | 7/1985 | Japan | 437/8 |
| 63-93129 | 4/1988 | Japan | 437/924 |
| 63-136542 | 6/1988 | Japan | 437/924 |

*Primary Examiner*—Frank E. Werner
*Assistant Examiner*—James T. Eller, Jr.
*Attorney, Agent, or Firm*—Oblon, Spivak, McClelland, Maier & Neustadt

[57] ABSTRACT

A method of positioning a wafer when plural chips arranged on the semiconductor wafer are to be measured by a probe apparatus. The direction in which probes of the probe apparatus are set is measured via a dummy wafer and stored as data. The positioning of the wafer can be achieved by the operation of a table on which the wafer is mounted. When the wafer is to be positioned, the chips-lined direction on the wafer is rotated to align with the moving coordinates of the table and then with the probes-set direction. A probing direction in which wafers are successively moved and a reference position on the wafer are determined, and this reference position is aligned with the position of the probes. Measurement is carried out relative to every position of the chips calculated from the reference position, while moving the table along the probing direction.

10 Claims, 7 Drawing Sheets

METHOD OF POSITIONING OBJECTS TO BE MEASURED

BACKGROUND OF THE INVENTION

1. Field of the Invention

The present invention relates to a method of positioning objects to be measured and more particularly, it relates to a method preferably used for positioning semiconductor wafers through the probe apparatus.

2. Description of the Related Art

Probe measurement is one of those measurements employed in the course of manufacturing semiconductor devices such as transistors and integrated circuits. The probe measurement comprises electrically connecting matrix like semiconductor chips formed by pattern-form technique on a semiconductor wafer to a measuring circuit, which consists of measuring devices and others, through probes of the prober to measure electric properties of the semiconductor chips.

More specifically, the wafer measurement through the prober comprises placing the wafer on a table movable in directions X, Y and Z which are crossed one another at right angles and also rotatable in direction $\theta$ on a plane which includes directions X and Y, arranging a probe card provided with probes above and opposite to the wafer and successively contacting the probes of the probe card with each semiconductor chip on the wafer while index-moving the table.

However, the positional accuracy of attaching the probe card is low and this makes it difficult to accurately contact the probes with electrode pads of the semiconductor chips. When the wafer measurement is to be conducted, therefore, it is needed that a lot of the electrode pads on the surface of the semiconductor chips are previously positioned relative to a lot of the probes.

This positioning of the electrode pads relative to the probes was conventionally carried out by rotating the probe card to correct it in direction $\theta$ and moving the table in directions X and Y.

When the probe card must be rotated, however, a system for rotating the probe card is additionally needed to make the apparatus large in size. Further, its measuring line is made complicated and this makes it impossible to obtain accurate measuring results. Therefore, a technique of correcting the wafer in direction $\theta$ without using the rotating system for the probe card but while rotating the table has attracted attention these days. This technique is disclosed in Japanese Patent Application Publication (KOKAI) No. 60-59746, for example.

The technique disclosed by No. 60-59746 comprises placing a wafer on the table, directing the probes of a probe card in directions X and Y (which denote a coordinate system of the probes), rotating the wafer with reference to this probes-arranged direction to make the electrodes-arranged direction (which denotes a coordinate system of the electrodes) of semiconductor chips on the wafer parallel to the coordinate system of the probes, and moving the semiconductor chips on the coordinate system of the probes to position the electrodes of the semiconductor chips relative to the probes of the probe card.

When wafers belong to a same kind and they are always placed on the table at a same position, therefore, it may be arranged that the angle of the table rotated and the distance of the table moved in directions X and y are calculated relating to the first sheet of wafer and that they are stored. When arranged like this, electrode pads of the semiconductor chips on the second sheet of wafer and the following ones can be automatically positioned relative to the probes of the probe card by rotating the table at the angle stored and moving it in directions X and Y only by the distance stored.

However, the position of every wafer mounted on the table becomes different from one another. In addition, the center position round which each of the wafers is rotated is shifted from one another. The distance that the table is moved to position the wafer relative to the probe card is thus made different for every wafer. This makes it impossible to achieve the above-described automatic positioning and makes it necessary to carry out the positioning relative to every wafer. The throughput of this probe measurement is thus left low.

In the case of the above-described positioning method, it is needed that the electrode coordinate system of the semiconductor chips is aligned with the probe coordinate system of the probe card and that the chips on the whole area of the wafer are then successively probed. The accuracy of probing the chips on the wafer must be quite high, ranging to several microns. It is therefore quite insufficient that the probing direction is aligned only with the direction of the probe card. Even when the position of the probe card is aligned with one of the semiconductor chips on the wafer, it is sometimes finely shifted from those positions of the other chips on this wafer. It is therefore conventionally needed that chips on the whole areas of every wafer are searched, that the wafer is corrected in direction $\theta$ by hand and that the probing is started after the positioning of the wafer relative to the probe card. This makes the operation throughput reduced to a great extent.

SUMMARY OF THE INVENTION

The object of the present invention is therefore to provide a method of accurately and automatically positioning electrodes of elements on an object to be measured relative to measuring probes without making the probe apparatus large in size.

According to the present invention, this object can be achieved by a method of positioning an object to be measured and suitable for use with an apparatus for measuring characteristics of each of elements arranged on the object while contacting probes with electrode pads of each of the elements, said method comprising a step of mounting the object to be measured on a table movable in a direction X and in a direction Y, which crosses the direction X at right angle, at least on a plane on which the elements are arranged on the object to be measured, and also rotatable on the plane; a step of aligning the elements-lined direction on the object with the directions X and Y in which the table can move; a step of rotating the object with reference to an angular position, at which the elements-lined direction on the object is aligned with the directions X and Y, to align the elements-lined direction on the object with a previously-stored direction in which the measuring probes are arranged; a step of detecting patterns of the plural elements on the object and recognizing a probing direction in which the elements on the object are successively moved to and contacted with the measuring probes; a step of determining a reference position on the object using the patterns of the plural elements on the object and reference image pattern data previously stored; a step of aligning the reference position with the measuring probes while moving the table in the directions X and Y; and a step of measuring the elements at their respective positions calculated from the reference position, while moving the table along the probing direction.

When measuring probes of a new kind are set relative to wafers of a new kind and the first wafer is to be processed, a step of detecting the probes-setting direction and position, and storing it as data at the time of newly setting the measuring probes can be added, and this data is used as long as the measuring probes are used. The detection of the probes-setting direction and position comprises placing a dummy object to be measured on the table after the measuring probes are newly set, contacting the probes with the dummy object to add probe marks on the dummy object, and detecting the probe marks through a camera.

When measuring probes of a new kind are set relative to objects of a new kind and the first object is to be processed, a step of creating a reference image pattern from a pattern detected at the elements on the object, after the step of aligning the elements-lined direction with the moving direction of the table, and storing it as data can be further added and when the objects of the new kind are to be processed, this reference image pattern data is used at the reference position determining step.

When measuring probes of a new kind are set relative to objects of a new kind and the first objects of this new kind is to be processed, a map relating to the useful elements on the object can be formed and stored as data at the reference image pattern storing step and when the other objects of the new kind are to be processed, this useful element map data is used at the element measuring step.

After the reference position aligning step but before the elements measuring step, it is preferable to add a step of moving the table in directions X and Y and correcting the positional shift of the electrodes of the elements relative to the measuring probes. When measuring probes of a new kind are set relative to objects of a new kind and the first object of this new kind is then to be processed, a step of storing, as data, the amount of correcting the positional shift of electrodes of the elements from the measuring probes at the correction step can be further added and when the second object and the following ones are to be processed, correcting the positional shift of electrodes of the elements from the measuring probes is conducted on the basis of the corrected amount data previously stored.

In a case where the probe setting direction is changed or measuring probes are exchanged with another relative to wafers of a same kind, the probes setting direction can be detected and stored as data at the time when the measuring probes are set. The corrected amount data is further corrected based on the probes setting direction data by rerotating the reference image pattern and determining a reference position, and the positional shift of electrodes of the elements from the measuring probes at the correction step can be corrected on the basis of the corrected amount data.

Typically, the object to be measured is a semiconductor wafer, the element is a semiconductor chip on the wafer and the measuring probes are those of the probe card.

According to an objects positioning method of the present invention, not the probe card provided with the measuring probes but the table in the probe apparatus is rotated. This makes it unnecessary to use the system for rotating the probe card. The probe apparatus itself can be made simple in structure. In addition, the line of measuring the chips on the wafer is not made complicated, thereby enabling this line and the apparatus to be easily maintained, which contributes to lowering product cost.

No system for rotating the probe card is needed. In the case of the high frequency measuring prober (or prober of the HF type), therefore, the probe card assembly can be set to the test head. Electrical properties of each of the chips on the wafer can be therefore accurately transmitted to the tester and measurement can be attained relative to particularly those devices whose access time is fast.

Quality and cost of high speed ASICs have been regarded as being important these days in manufacturing LSIs. According to the present invention, nobody is needed to exchange the probe cards and to position the chips on the wafer relative to the probes of the probe card in the case of manufacturing a few ASICs which belong to each of various kinds. In the case where a few LSIs which belong to each of various kinds are to be tested, therefore, their cost can be reduced to a great extent and accurate wafer test can be realized.

Further, the probes setting direction can be automatically detected and recognized at the time when the measuring probes are set, and using the probes setting direction information and the reference information previously stored relating to objects of the same kind, the positioning of element electrodes on the wafer can be automatically conducted relative to the measuring probes, so that measuring operation by means of the probes can be made full-automatic.

Still further, positioning and probing can be similarly made automatic when reference information is already stored relating to objects of a ne kind which are to be newly processed.

Still further, positioning can be automatically conducted without positioning element electrodes on every object relative to the probes. This can save manpower and enhance throughput to a great extent.

Still further, patterns on the object to be measured can be detected and the elements-lined direction can be automatically recognized. This enables the probes to accurately and surely contact element electrodes on the object, thereby guaranteeing the accuracy of the probing operation.

These and other objects as well as merits of the present invention will become apparent from the following detailed description with reference to the accompanying drawings.

DETAILED DESCRIPTION OF THE PREFERRED EMBODIMENTS

Figure 1:
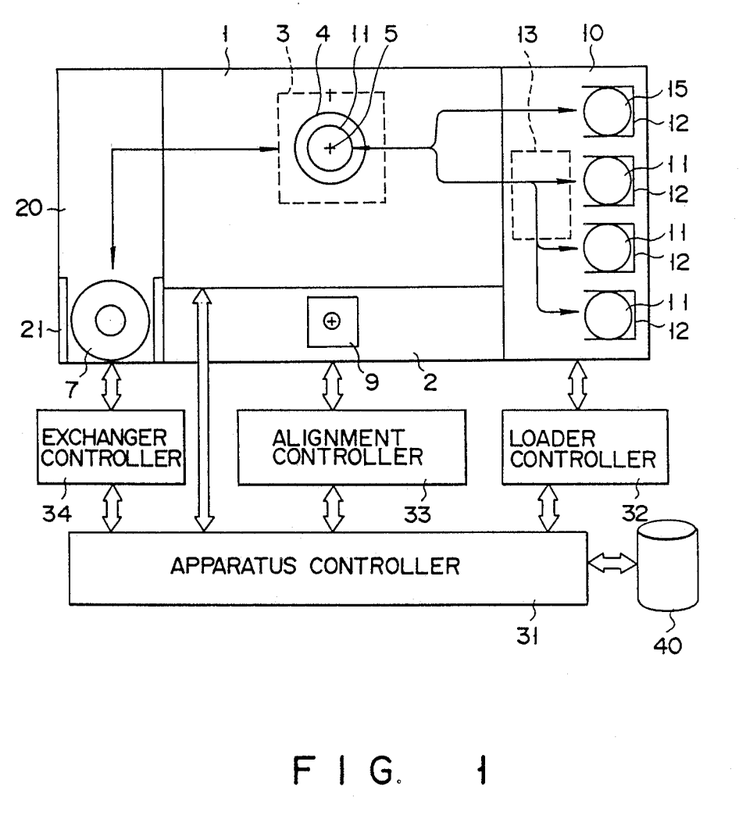
FIG. 1 shows the whole system of a wafer prober employed to realize a method of the present invention.
Figure 2:
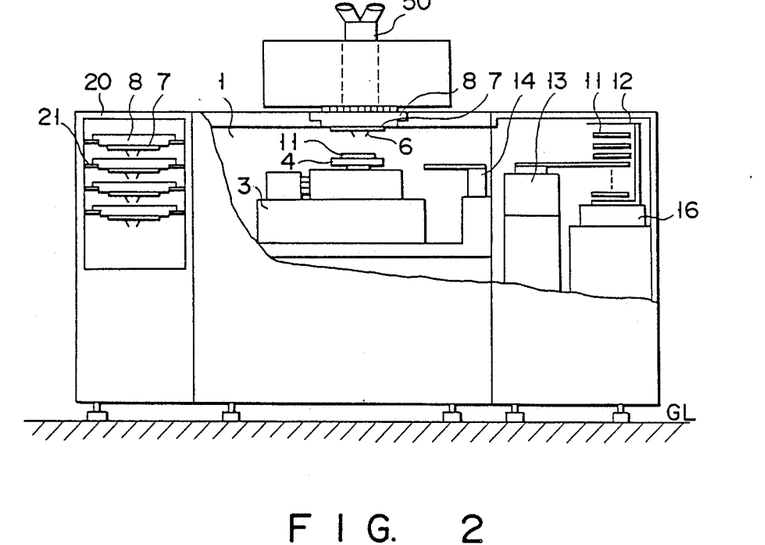
FIG. 2 is a sectional view showing an example of the probe apparatus.

In FIGS. 1 and 2, reference numeral 1 denotes a probe apparatus, and 2 an alignment unit. Probe apparatus 1 is provided with main stage 3. Table 4 on which wafer 11 to be measured is mounted is attached to main stage 3. Main stage 3 can move in directions X and y which are crossed at a right angle on a plane, and cause wafer-mounted table 4 to move together in directions X and y. Wafer-mounted table 4 is also moved in direction Z which crosses directions X and Y at right angles, so that table 4 is moved up and down. Table 4 is also rotated round a shaft which extends in direction Z.

Symbol + in probe apparatus 1 represents test position 5 at which probe card 7 having measuring probes is set as shown in FIG. 2.

Probe card 7 which is in ring insert 8 can be automatically exchanged with others by a probe cards exchanger, which will be described later (see Japanese Patent Applications Publication (KOKAI) No. 62-169341 and 263647 if you want to know something about the probe cards exchanger).

The probe card includes a base made of insulating synthetic resin, for example, wirings printed on the base, and probe 6. One end of each of the print wirings is connected to probes 6 while the other thereof electrically to a measuring tester through a probe pin, for example (when the prober is of the HF type, the test head is located above test position 5 of the prober body). Probe card 7 is attached to ring insert 8, which is detachably attached to the head plate on the top of probe apparatus 1.

Openings are forced in the centers of probe card 7 and ring insert 8 and microscope (or television camera) 50 is located above these openings to see wafer 11 set under and probes 6 of probe card 7 through these openings.

Camera 9 which serves as an image recognizing means for achieving the alignment process is arranged on alignment unit 2, as shown in FIG. 2. Wafer-mounted table 4 is moved under camera 9 to align semiconductor chips on the wafer.

Reference numeral 10 represents an autoloader and 20 the probe cards exchanger.

Wafer cassettes 2 each housing plural (or 25 sheets of, for example) semiconductor wafers 11, which are to be measured, piled one upon the others with a certain distance interposed between the adjacent wafers are set on cassette-mounted bases 16, respectively, in autoloader 10. Loader stage 13 has a wafer pincette and a wafer table and picks up wafer 11 in the cassette by its wafer pincette and set it on its wafer table. Loader stage 13 is associated with wafer handling arm 14 which can be driven by a Y-direction driver system and a Z-direction lifter system. Arm 14 serves to carry a wafer on loader stage 13 to wafer-mounted table 4 and another wafer on table 4 onto the wafer table on loader stage 13.

Plural dummy wafers 15 each of which is probe-traced when the probe of probe card 7 is contacted with it are housed in cassette 12 in autoloader 10.

Plural ring inserts 8 each mounting probe card 7 are placed on shelves 21 in card exchanger 20. Probe cards 7 are consumption goods and must be exchanged with new ones in several days. This is the reason why plural probe cards 7 of same kind are placed on the shelves, and they are used successively.

In a case where objects to be measured are logic LSIs, for example, they are a few which belong to one kind, but grouped to too many kinds. This makes it necessary to exchange the probe cards several times in a day. Plural probe cards which correspond to the kinds of LSIs to be measured are placed on shelves 21 and kept in memory by exchanger controller 34 in this case. Every time when measuring of a predetermined number of wafers which belong to a kind is finished and wafers of another kind are to be measured, probe card assemblies 7, 8 are exchanged with those which belong to the new kind by probe card exchanger 20 prior to the new measuring process.

Autoloader 10 is driven and controlled by loader controller 32, alignment unit 2 by alignment controller 33 and card exchanger 20 by exchanger controller 34.

Main stage 3 of probe apparatus 1, that is, moving and rotating of the wafer-mounted table are controlled by apparatus controller 31. This apparatus controller 31 is intended to control the whole of the probe apparatus. To meet this purpose, apparatus controller 31 exchanges data and control information with loader, alignment and exchanger controllers 32, 33 and 34 to control these controllers. Computers, for example, are set in these controllers 31-34.

File unit 40 is connected to apparatus controller 31 to store parameters relating to kinds, pattern data of wafers to be probed, correction data and positional correction data to probe wafers.

The present invention is realized using the abovedescribed probe apparatus and wafer positioning manner and probe operation in this case will be described citing reference symbols in flow charts shown in FIGS. 10A, 10B and 11.

The following operation is carried out in accordance with programs set in controllers 31-34.

Wafers of a New Kind are to be Measured

Figure 10A:
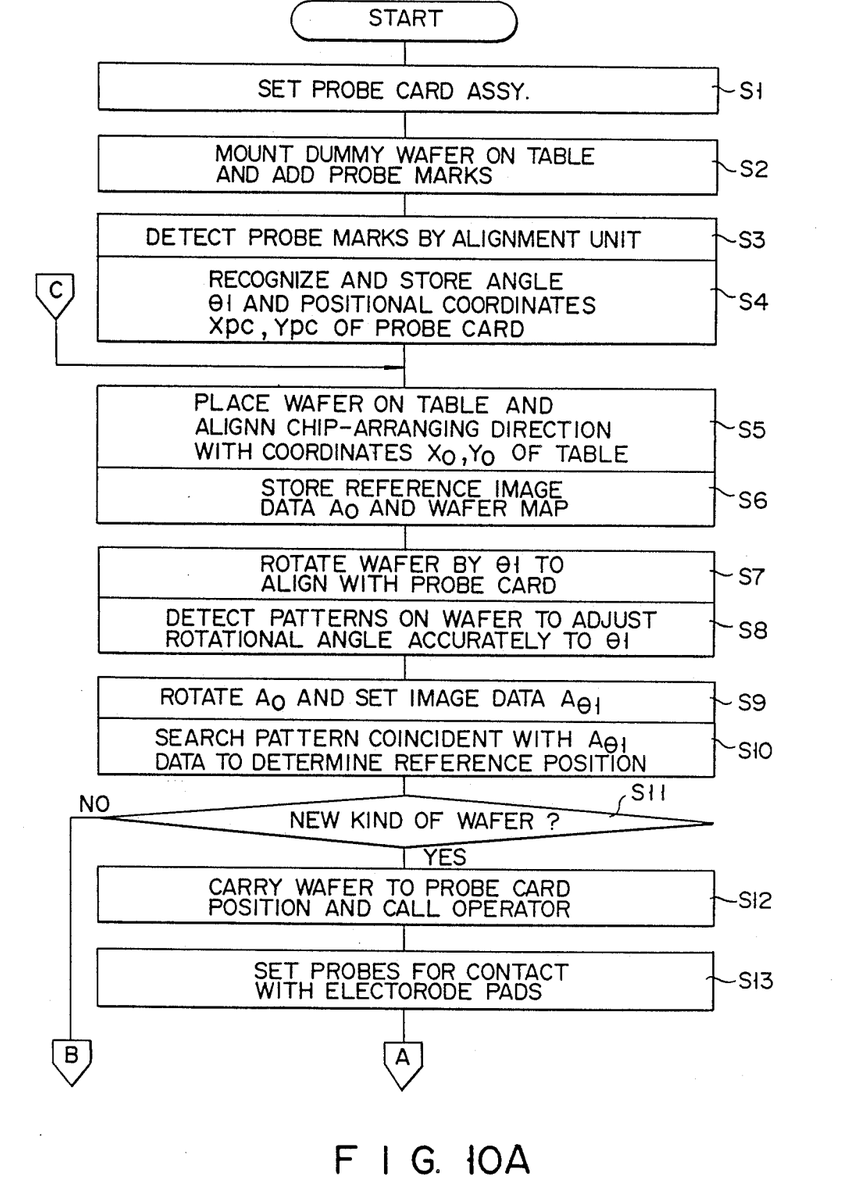
Figs. 10A and 10B show flow charts for repeatedly processing wafers in new and same kinds.
Figure 10B:
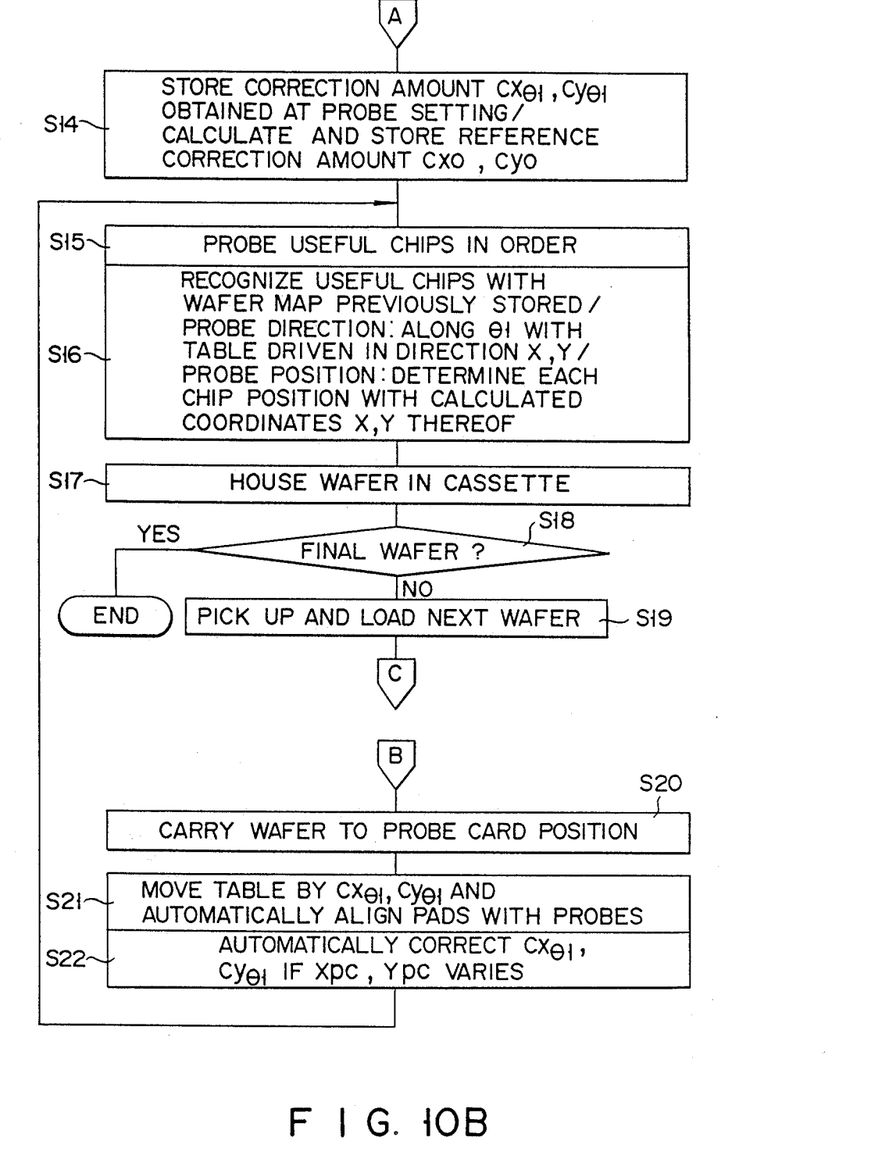
Figure 11:
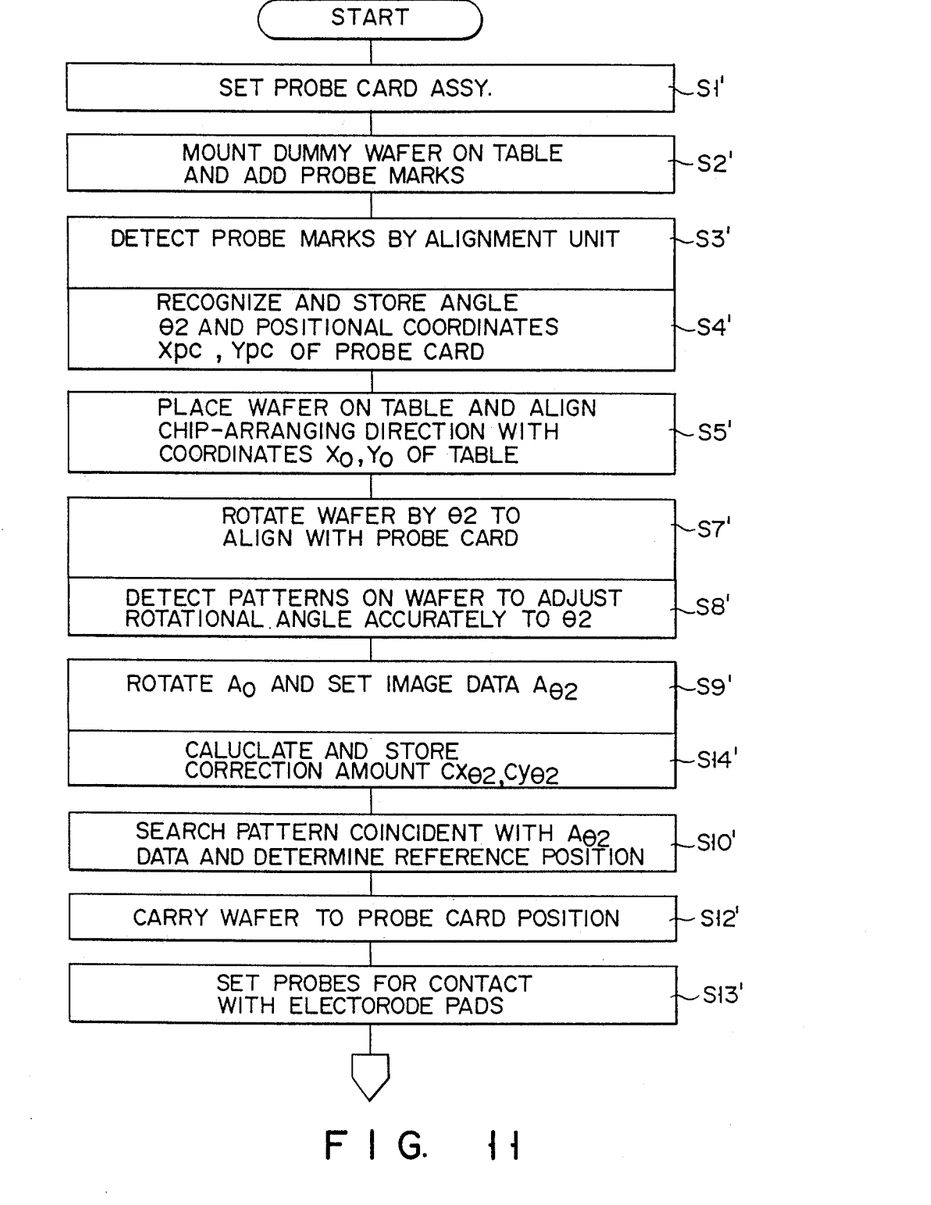
FIG. 11 shows a flow chart for processing wafers at the time when the probe card is exchanged with another.

When wafers of a new kind are set, as shown in FIG. 10A, probe card assembly 7, 8 of a new kind which corresponds to the kind of wafers set is placed at test position 5 by probe card exchanger 20 (step S1).

Responsive to a command of apparatus controller 31, loader controller 32 causes autoloader 10 to pick up dummy wafer 15 from cassette 12 and mount it on table 4. Main stage 3 then moves table 4 to test position 5 and lift it in direction Z to contact probes 6 of probe card 7 with the surface of dummy wafer 15 and mark them on it (step S2).

Figure 3:
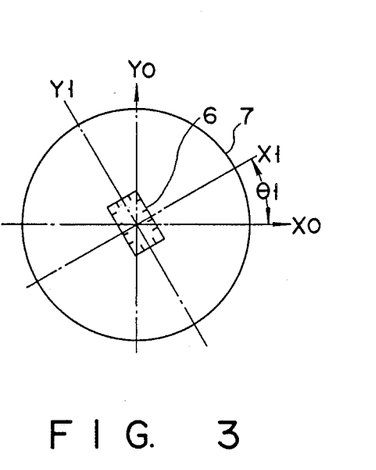
FIG. 3 shows a probe card shifted from its setting direction.

Main stage 3 then moves dummy wafer 15 on table 4 to under camera 9 of alignment unit 2. When probe marks are detected on dummy wafer 15 (step S3), there are recognized at alignment unit 2 the probe positions of probe card 7 (which represent the position of the probe card) and angle $\theta_1$ of probe card 7 set relative to a coordinate system $(X_0, Y_0)$, as shown in FIG. 3, based on directions X and Y in which main stage 3 is moved (step S4).

Figure 4:
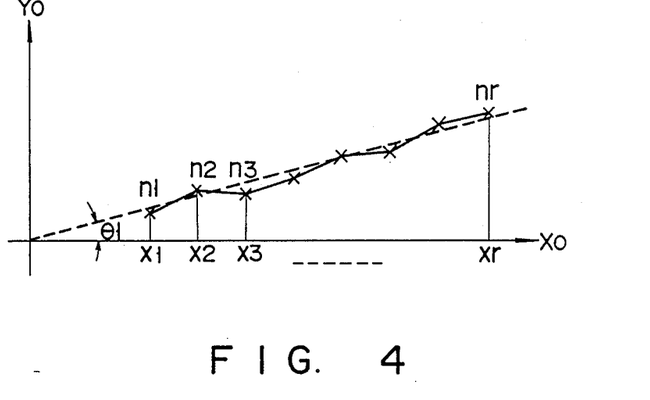
FIG. 4 is a graph showing the manner of calculating the direction in which the probe card is set.

This set angle $\theta_1$ can be calculated as follows. It is assumed that the probes are marked on dummy wafer 15 as shown by $n_1, n_2, -n_r$ in FIG. 4. These probe marks $n_1, n_2, -n_r$ are detected by camera 9 and values $x_1, x_2, -n_r$ on axis X can be obtained from the coordinate ($X_0, Y_0$). Angle $\theta_1$ can be thus calculated, using system the following equation.

$$\tfrac{1}{2} \tan \theta_1 (x_r^2 - x_1^2) = \int_{x=x_1}^{x=x_r} f(x)dx \tag{1}$$

wherein f(x) represents a polygonal graph formed by connecting probe marks $n_1, n_2, -n_r$ successively with a straight line.

Information of set angle $\theta_1$ thus calculated is stored in file unit 40 (step S4).

Average coordinates $X_{pc}$ and $Y_{pc}$ can be obtained from coordinates $(x_1, y_1), (x_2, y_2), -(x_r, y_r)$ of probe marks $n_1, n_2, -n_r$.

$$X_{pc} = \frac{x_1 + x_2 + \ldots + x_r}{r} \tag{2}$$

$$Y_{pc} = \frac{y_1 + y_2 + \ldots + y_r}{r} \tag{3}$$

The coordinates ($X_{pc}, Y_{pc}$) are stored as the positional coordinates of the probe card in file unit 40 (step S4).

When the above is finished, dummy wafer is returned into cassette 12.

Wafer 11 which belongs to the kind of wafers newly to be measured and which is housed in cassette 12 is picked up by the pincette of loader stage 13 and prealigned by loader stage 13 with reference to the orientation flat formed on wafer 11. Wafer 11 thus pre-aligned is placed on table 4 by handling arm 14. Wafer 11 thus placed on table 4 is seemingly positioned because it has been already pre-aligned. However, electrode sections of each of semiconductor chips on the surface of wafer 11 are extremely fine and this makes it necessary to more accurately align wafer 11.

Figure 5:
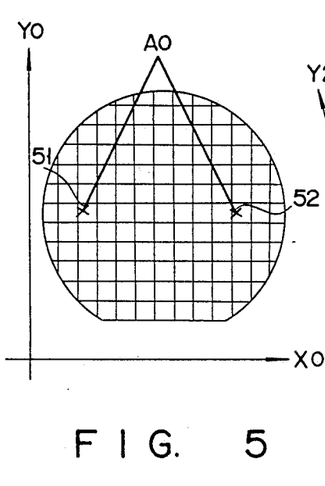
FIGS. 5 and 6 show the chips-lined direction on the wafer aligned with the coordinate system of a wafer-mounted table and rotated from it by $\theta$.

Table 4 on which wafer is mounted is therefore moved to under alignment camera 9. The surface of wafer 11 is imaged by camera 9. As shown in FIG. 5, image patterns are detected from this image data, relating to an optimum number of perfect semiconductor chips (from which half-broken chips on the peripheral rim of wafer 11 are excluded) formed on wafer 11, or chips 51 and 52 on a line on wafer 11, for example. It is then detected from this image pattern data on wafer 11 how moving directions $X_0$ and $Y_0$ of table 4 are shifted from the chips-lined or chip-arranging direction on the surface of wafer 11. Table 4 is rotated in the direction of making the shift zero to automatically align the chip-slined direction on wafer 11 with the coordinates ($X_0, Y_0$) of table 4 (step S5).

Wafer 11 belongs to the new kind. Therefore, the pattern data detected by camera 9 at step 5 is stored as reference image data $A_0$ in file unit 40. At the same time, only perfect chips are selected of those formed on wafer 11 and the arrangement of these chips is also stored as a wafer map in file unit 40 (step S6).

Figure 6:
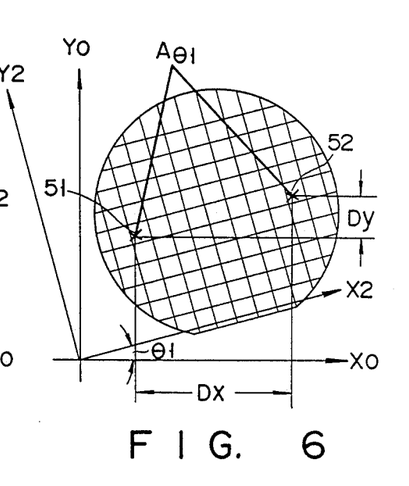

Wafer 11 is then correctly rotated only by set angle $\theta_1$ of probe card 7 (step S7). The image patterns of chips 51 and 52 formed on peripheral portion of wafer 11 are detected by alignment unit 2 to control wafer 11 to make the corrective amount of its rotation just $\theta_1$ (step S8). As shown in FIG. 6, corrective rotation angle $\theta_1$ can be calculated from distances $D_x$ and $D_y$, which are caused between chips 51 and 52 on the coordinates ($X_0, Y_0$), as follows.

$$\theta_1 = \tan^{-1} \frac{D_y}{D_x} \tag{4}$$

Wafer 11 is controlled to make the corrective amount of its rotation just $\theta_1$.

The chips-lined direction on semiconductor wafer 11 or the probe direction in which chips positions are successively moved relative to probes 6 of probe card 7 can be thus accurately detected and recognized.

An image data obtained under the condition that reference image data $A_0$ stored in rotated only by set angle $\theta_1$ of probe card 7 is formed by data operational process and stored and kept as $A_{\theta 1}$ (step S9). Main stage 3 is moved in directions $X_0$ and $Y_0$ at alignment unit 2, referring to this rotated image data $A_{\theta 1}$, and an image pattern which is in accordance with rotated image pattern $A_{\theta 1}$ is searched from the image photographed by camera 9. When it is found, its position is regarded as reference position for wafer 11 (step S10).

It is asked here whether or not wafer 11 belongs to the new kind (step S11) and it is recognized that the answer is "YES". After this recognition, the wafer is moved to test position 5 to bring the reference position under coincidence with the position ($X_{pc}, Y_{pc}$) of probe card 7, and operator call is conducted (step S12).

When wafer 11 is under this condition, the positioning of probes of the probe card relative to the chips on wafer 11 is not completed because precise positions of electrode pads of chips on wafer 11 are not recognized yet, although the chips-lined direction on wafer 11 is made parallel to the direction in which probes of the probe card are arranged.

Using microscope 50, therefore, the operator moves table 4 in directions $X_0$ and $Y_0$ through main stage 3 to bring the electrode pads of semiconductor chips under coincidence with the probes of the probe card (step S13), and corrective amount $Cx_{\theta 1}, Cy_{\theta 1}$ of the movement of table 4 is stored in file unit 40 (step S14).

Corrective reference amount $Cx_0, Cy_0$ under the condition of $\theta 1=0$ is calculated from this corrective amount $Cx_{\theta 1}, Cy_{\theta 1}$ and stored in file unit 40 (step S14). The relation of corrective amount $Cx_{\theta 1}, Cy_{\theta 1}$ relative to corrective reference amount $Cx_0, Cy_0$ is as follows in this case.

Figure 7:
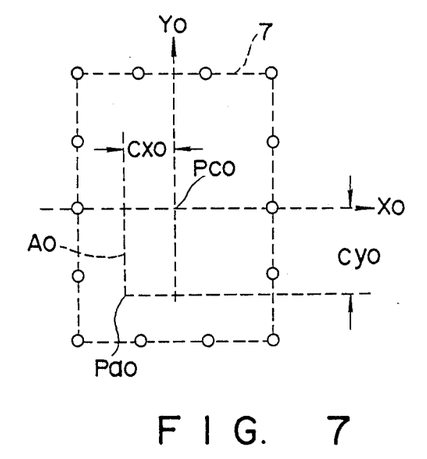
FIGS. 7 and 8 are intended to explain the correction of wafer position at the time when electrode pads of chips on the wafer are positioned relative to the probes.
Figure 8:
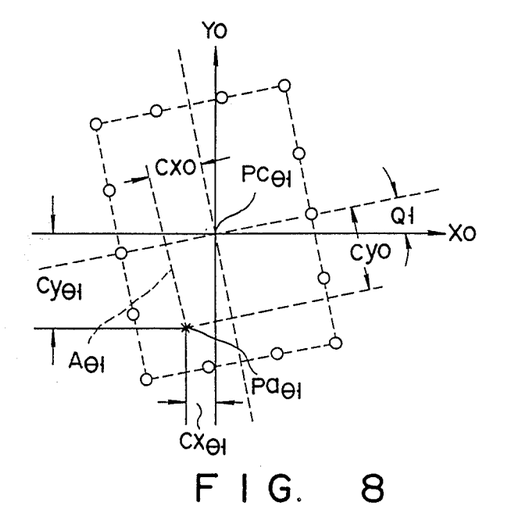

FIG. 7 is intended to explain the shift of the position of probe card 7 from the semiconductor chips on the wafer, which is not correctively moved by the operator yet, when $\theta 1=0$ and FIG. 8 intended to explain the shift when $\theta 1 > 0$.

In FIGS. 7 and 8, $Pa_0$ represents the position of the wafer when $\theta 1=0$, $Pa_{\theta 1}$ the position of the wafer when $\theta 1 \neq 0$, $Pc_0$ the position of the probe card when $\theta 1=0$, and $Pc_{\theta 1}$ the position of the probe card when $\theta 1 \neq 0$. As apparent from FIGS. 7 and 8, $$Cx_{\theta 1} = \sqrt{Cx_0^2 + Cy_0^2} \times \cos\left(\tan^{-1}\frac{Cy_0}{Cx_0} + \theta 1\right) \tag{5}$$

$$Cy_{\theta 1} = \sqrt{Cx_0^2 + Cy_0^2} \times \sin\left(\tan^{-1}\frac{Cy_0}{Cx_0} + \theta 1\right) \tag{6}$$

$$\sqrt{Cx_0^2 + Cy_0^2} = \sqrt{Cx_{\theta 1}^2 + Cy_{\theta 1}^2} \quad (7)$$

After the positioning of probes 6 of probe card 7 relative to the electrode pads of the semiconductor chips on the wafer is finished as described above, probing is successively carried out relative to semiconductor chips on the wafer in a direction which is shifted from the moving coordinate system ($X_0$, $Y_0$) of main stage 3 only by angle $\theta 1$ (step S15).

Figure 9:
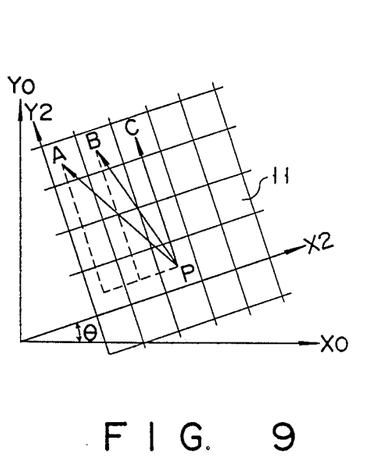
FIG. 9 is intended to explain probing direction and index-movement.

Using the wafer map data of the perfect chips initially stored before wafer 11 is rotated, perfect chips A, B and c are successively probed in this case, as shown in FIG. 9. In order to eliminate any error of the probes of the probe card moving from a chip to another chip, it is important in this case that coordinates of chips A, B, C — to be measured are calculated referring to the coordinates of center chip P and that the moving amount of the probe card on the coordinates ($X_0$, $Y_0$) is then calculated (step S16).

In a case where coordinates on probe axes ($X_2$, $Y_2$) are converted into those on moving coordinates ($X_0$, $Y_0$) of main stage 3 or table 4, they can be obtained from the following equations.

$$x_0 = x_2 \cos\theta + y_2 \sin\theta \quad (8)$$

$$y_0 = y_2 \cos\theta + y_2 \sin\theta \quad (9)$$

When the probe card moves from chip A to chip B and from chip B to chip C in FIG. 9, the difference between the coordinate values of a chip and another is regarded as every moving amount of the probe card.

$$\vec{AB} = \vec{B(xb, yb)} - \vec{A(xa, ya)} \quad (10)$$

$$\vec{BC} = \vec{C(xc, yc)} - \vec{A(xb, yb)} \quad (11)$$

Probe operation can be thus carried out, accurately positioning probes of the probe card relative to all of the perfect chips on wafer 11.

When the probe operation is finished relative to wafer 11, it is returned into cassette 12 (step S17) and it is asked whether or not this wafer 11 is final (step S18). The answer at step S18 is usually "NO" and next wafer 11 to be processed is therefore picked up from cassette 12 (step S19) and the following process is repeated. When the answer at step S 18 is "YES", the probe operation is finished.

Where Wafers of Same Kind are to be Repeatedly Processed

When the first sheet of wafer of one kind is positioned and measured as described above, a second sheet of wafer and the following ones can be automatically measured.

Reference image data $A_0$ and corrective reference amount $Cx_0$, $Cy_0$ are stored in file unit 40 in this case, as described above. When exchanging of probe cards 7 is not conducted yet, set angle $\theta 1$ of probe card 7, rotated image data $A\theta 1$ and corrective amount $Cx_{\theta 1}$, $Cy_{\theta 1}$ are also stored in file unit 40.

In the case where wafers of same kind are to be measured, wafer 11 is placed on table 4, image patterns of chips 51 and 52 are detected at alignment unit 2, as described above, and the chips-lined direction is brought into accordance with moving directions $X_0$ and $Y_0$ of main stage 3, referring to the image patterns (step S5). Step S6 which is unnecessary in this case is omitted. Table 4 is rotated only by $\theta 1$ and further finely adjusted using the image patterns (steps S7 and S8). Step S9 which is unnecessary in this case is omitted. The reference position of wafer 11 is detected, as described above, using rotated image data $A_{\theta 1}$ already stored (step S10).

It is checked whether or not wafer 11 belong to the new kind (step S11) and it is confirmed that the answer is "NO". The reference position of wafer 11 is applied to the position (Xpc, Ypc) of probe card 7 at test position 5 (step S20). When table 4 is moved only by corrective amount $Cx_{\theta 1}$, $Cy_{\theta 1}$ stored, the positioning of electrode pads of semiconductor chips on wafer 11 can be automatically conducted relative to probes of probe card 7 (step S21).

In a case where the probe card is moved or must be exchanged with a new one because of its having been worn, corrective moving amount $Cx_{\theta 1}$, $Cy_{\theta 1}$ is automatically picked up, as will be described later, and the process is advanced (step S21).

After the positioning of electrode pads of chips on wafer 11 relative to probes of probe card 7, probing is carried out, correcting angle difference $\theta 1$ between probe direction ($X_2$, $Y_2$) and moving direction ($X_0$, $Y_0$) of main stage 3, as described above (steps S15–S19).

Where Probe Card is moved or exchanged with a New One

The step S21 or the case where the probe card is moved or exchanged with a new one while wafers of same kind are being measured will be described in detail referring to FIG. 11.

After a new probe card is set (step S1'), dummy wafer 15 is mounted on table 4, moved under probe card 7 and lifted to add marks of probes of probe card 7 onto it (step S2').

Dummy wafer 15 is carried to alignment unit 2 and probes marks on wafer 15 are detected (step S3') to confirm position (Xpc', Ypc') and set angle $\theta 2$ and to rewrite angle $\theta 1$ to $\theta 2$ in file unit 40, as described above (step S4').

Wafer 11 to be measured is placed on table 4, image patterns of chips 51 and 52 on wafer 11 are detected at alignment unit 2, as described above, and the chipslined direction is brought into accordance with moving direction $X_0$, $Y_0$ of main stage 3, referring to the image patterns (step S5').

Table 4 is rotated only by angle $\theta 2$ (step S7') and then adjusted to rotate just $\theta 2$, using the image pattern data (step S8').

Image data $A_{\theta 2}$ and moving corrective amount $Cx_{\theta 2}$, $Cy_{\theta 2}$ are obtained by rotating reference image data $A_0$ and corrective reference amount $Cx_0$, $Cy_0$ only by $\theta 2$, respectively (steps S9' and S14').

$$Cx_{\theta 2} = \sqrt{Cx_0^2 + Cy_0^2} \times \cos\left(\tan^{-1}\frac{Cy_0}{Cx_0} + \theta 2\right) \quad (12)$$

$$Cy_{\theta 2} = \sqrt{Cx_0^2 + Cy_0^2} \times \sin\left(\tan^{-1}\frac{Cy_0}{Cx_0} + \theta 2\right) \quad (13)$$

Image patterns on wafer 11 are searched through camera 9 and a pattern which coincides with rotated image data $A_{\theta 2}$ is detected to determine reference position Pa $\theta 2$ relating to semiconductor chips on the wafer (step S10'). This reference position is then applied to probe card position (Xpc', Ypc') at the test position (step S12'). The wafer is moved by corrective amount $Cx_{\theta 2}$, $Cy_{\theta 2}$ to automatically position electrode pads of the semiconductor chips on the wafer relative to probes of probe card 7 (step S13').

Probing is then carried out relative to the chips on the whole area of the wafer, similarly as described above.

Calculating image data $A_{\theta 2}$ and corrective amount $Cx_{\theta 2}$, $Cy_{\theta 2}$, full automatic probing can be thereafter carried out under the probe card just set.

If reference image data $A_0$ and corrective reference amount $Cx_0$, $Cy_0$ which were obtained when any previous positioning was set are stored, image data $A_{\theta r}$ and moving corrective amount $Cx_{\theta r}$, $Cy_{\theta r}$ can be obtained by detecting and confirming set angle $\theta r$ of probe card 7 by the dummy wafer. This enables automatic probing to be carried out, as described above.

When the automatic probe card exchanger is added, a dummy wafer is used and the system is controlled in the above manner, therefore, nobody is needed to realize a full-automatic probe process.

(Where Wafers of Various kinds are to be Measured)

In a case where a few LSIs of various kinds are to be measured, the reference image data and corrective reference amount are previously calculated relating to those which belong to each of the various kinds, and they are stored in the file unit. When a system for detecting wafer IDs on wafers which denote the kinds of their wafers is added together with a means for recognizing the kind of every wafer, automatic exchange of probe cards and automatic positioning of wafers relative to probe cards can be achieved using these data stored, thereby enabling full-automatic probing to be conducted.

Although the present invention has been described in detail citing some preferred embodiments shown in the accompanying drawings, it should be understood that various changes and modifications can be made to the embodiments without departing from the spirit and scope of the present invention.

For example, probe card 7 is mounted in insert ring 8 in the above-described cases, but the present invention can be applied to the shift of the probe card, which is attached directly to a test head, in direction $\theta$.

What is claimed is:

1. A method of positioning an object to be measured and suitable for use with an apparatus having a detecting means which is capable for detecting an image pattern of elements arranged on the object, and memory means for memorizing the image pattern and positional information of the elements, for measuring characteristics of each of the elements while contacting probes with electrode pads of each of the elements, said method comprising step of mounting the object to be measured on a table movable in a direction X and in a direction Y, which crosses the direction X at right angle, on a plane on which the elements are arranged on the object to be measured, and also rotatable on the plane;

step of aligning the elements-lined direction on the object with the directions X and Y in which the table can move;

a step of rotating the object with reference to an angular position, at which the elements-lined direction on the object is aligned with the directions X and Y, to align the elements-lined direction on the object with a previously-stored direction in which the measuring probes are arranged;

step of detecting the patterns of the plural elements on the object and recognizing and determining a probing direction in which the elements on the object are successively moved and contacted with the measuring probes;

a step of determining a reference position on the object using the probing direction and reference image pattern data previously stored;

a step of aligning the reference position with the measuring probes while moving the table in the directions X and Y; and step of measuring the elements at their respective positions calculated from the reference position, while moving the table along the probing direction.

2. The method according to claim 1, further including a step of detecting the setting direction and position of measuring probes corresponding to an object and storing the data representative of the detected result when the object is processed, after the measuring probes corresponding to a new kind of object has been set, or after the measuring probes corresponding to the object have been repeatedly changed, or after the measuring probes have been moved, wherein the data is maintained as long as the measuring probes are used.

3. The method according to claim 2, wherein, in the step of detecting the setting direction and position of the measuring probes, a dummy object is mounted on the table after the measuring probes have been set, and the probes are brought into contact with the dummy object, whereby probe marks are impressed on the dummy object and the impressed probe marks are detected by the detecting means.

4. The method according to claim 1, wherein, when a new kind of object, or an object the data relating to which have not been stored, is set and processed after measuring probes corresponding to the new kind of object have been set, a reference image pattern storing step is performed in which patterns of the elements of the object placed on the table which has been positioned are searched, the data on a reference image pattern is prepared, the data on the positions of the patterns is stored as reference positional data, and the reference image pattern data and the reference positional data are stored, and wherein, in the subsequent processing of said kind of object, the reference image pattern data and the reference positional data obtained in the reference image pattern storing step is applied to the step of determining the reference position.

5. The method according to claim 4, wherein the reference image pattern is obtained such that patterns of the elements are searched by the detecting means set in a fixed position to detect a pattern having a given characteristic, and the data on this pattern is stored, and wherein the position of the table o which the object is placed is used as a reference position.

6. The method according to claim 1, wherein, in the probe direction determining step, the probe direction, or a precise arranging direction of the elements, is detected and recognized, and in the reference position determining step, the data obtained by subjecting reference image pattern data to rotationprocessing corresponding to the setting direction of the measuring probes is used for searching and detecting the patterns of the elements to determine the reference position of the kind of the object corresponding to the current measuring probes.

7. The method according to claim 1, wherein, in the case of processing the first object of a new kind, after the reference position is transferred below the measuring probes in the reference position aligning step and prior to the measuring step, the table is moved in the X- and Y-directions, thus performing a step of correcting a displacement between the measuring probes and the electrodes of the elements, the corrected amount being stored and used as correction data for the subsequent object to be measured, and wherein a reference correction data is obtained by coordinate-transforming the correction data so as to make the direction of the measuring probes or the arranging direction of the elements coincide with the direction of movement of the table.

8. The method according to claim 7, wherein, when an object of the same kind as said kind is set, the position of the object is corrected, in the reference position aligning step, corresponding to the setting direction of the measuring probes, with use of said reference correction data, whereby the automatic positioning between the measuring probes and the elements can be performed.

9. The method according to claim 1, wherein the reference position, the direction of probes and the coordinate map of effective elements on the object are recognized after the reference position determining step and prior to the measuring step, and the probing is performed based on these data units, and wherein said effective elements mean elements having perfect patterns on the object, and whether or not the elements have perfect patterns is recognized based on the data obtained by a detector for detecting edges of the object.

10. The method according to claim 1, wherein said object is a semiconductor wafer, and said elements are semiconductor chips on the wafer.

* * * * *